(12) United States Patent
Krone (10) Patent No.: US 7,489,260 B2
(45) Date of Patent: Feb. 10, 2009

(54) RESOLVER HALL DECODING CIRCUIT

(75) Inventor: Stephen R. Krone, Westlake, OH (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 11/859,213

(22) Filed: Sep. 21, 2007

(65) Prior Publication Data

US 2008/0074298 A1 Mar. 27, 2008

Related U.S. Application Data

(60) Provisional application No. 60/827,106, filed on Sep. 27, 2006.

(51) Int. Cl.
  *H03M 5/22* (2006.01)
  *H03M 1/48* (2006.01)
(52) U.S. Cl. .................. 341/116; 341/111; 318/603
(58) Field of Classification Search ............. 341/111, 341/112, 113, 114, 115, 116; 318/603
  See application file for complete search history.

(56) References Cited

U.S. PATENT DOCUMENTS

| | | | | |
|---|---|---|---|---|
| 4,340,939 A | * | 7/1982 | Mayer | ................ 341/115 |
| 4,401,932 A | * | 8/1983 | Hermansdorfer et al. | .... 341/116 |
| 4,551,708 A | | 11/1985 | Welburn | |
| 4,568,865 A | | 2/1986 | Welburn | |
| 4,618,808 A | * | 10/1986 | Ish-Shalom et al. | ......... 318/696 |
| 4,723,117 A | | 2/1988 | Griffiths | |
| 4,737,698 A | * | 4/1988 | McMullin et al. | ........... 318/653 |
| 4,855,734 A | | 8/1989 | Elsdoerfer | |
| 4,855,744 A | * | 8/1989 | Sayers | ................ 341/116 |
| 4,954,763 A | * | 9/1990 | Kumar et al. | ............... 318/603 |
| 4,992,716 A | * | 2/1991 | Ellis | ......................... 318/661 |
| 5,008,670 A | * | 4/1991 | Zimmer | ..................... 341/113 |
| 5,218,298 A | * | 6/1993 | Vig | ............................. 324/251 |
| 6,084,376 A | * | 7/2000 | Piedl et al. | .................. 318/605 |
| 6,577,095 B1 | | 6/2003 | Firehammer | |
| 2002/0101208 A1 | * | 8/2002 | Yost | ........................... 318/254 |

* cited by examiner

*Primary Examiner*—Howard Williams
(74) *Attorney, Agent, or Firm*—Renner, Otto, Boisselle & Sklar, LLP (57) ABSTRACT

A device for converting position data to Hall code data includes a data input for providing the position data, a data output for providing the Hall code data, a first adder circuit operative to provide a sum of a first predetermined number and a value provided by the data input, and a memory circuit for storing a plurality of data. A most significant bit of the data input is provided to a first storage location of the memory circuit, and a most significant bit of the first adder circuit's sum is provided to a second storage location of the memory circuit. An output of the memory circuit is operatively coupled to the data output.

20 Claims, 5 Drawing Sheets

| Rotor Electrical Position (Degrees) | Resolver Position Output (Decimal) | Required Hall Code $S_A\ S_B\ S_C$ (Binary) |
|---|---|---|
| 0 . . 60 | 0 . . 682 | 100 |
| 60 . . 120 | 683 . . 1364 | 110 |
| 120 . . 180 | 1365 . . 2047 | 010 |
| 180 . . 240 | 2048 . . 2729 | 011 |
| 240 . . 300 | 2730 . . 3412 | 001 |
| 300 . . 360 | 3413 . . 4095 | 101 |

Table 1. Typical digital to hall code mapping

| Rotor Electrical Position (Degrees) | Resolver Position Output (Decimal) | Required Hall Code $S_A S_B S_C$ (Binary) |
|---|---|---|
| 0 ⋮ 60 | 0 ⋮ 682 | 100 |
| 60 ⋮ 120 | 683 ⋮ 1364 | 110 |
| 120 ⋮ 180 | 1365 ⋮ 2047 | 010 |
| 180 ⋮ 240 | 2048 ⋮ 2729 | 011 |
| 240 ⋮ 300 | 2730 ⋮ 3412 | 001 |
| 300 ⋮ 360 | 3413 ⋮ 4095 | 101 |

Table 1. Typical digital to hall code mapping

FIG. 1

| Rotor Electrical Position (Degrees) | Resolver Position Output (Decimal) | Required Hall Code $S_A S_B S_C$ (Binary) | Resolver Position Output (Decimal)  MSB = $S_C$ | Resolver Position Output + 1365 (Decimal)  MSB = $S_B$ | Resolver Position Output + 2731 (Decimal)  MSB = $S_A$ |
|---|---|---|---|---|---|
| 0 . . . 60 | 0 . . . 682 | 100 | 0 . . . 682 | 1365 . . . 2047 | 2731 . . . 3413 |
| 60 . . . 120 | 683 . . . 1364 | 110 | 683 . . . 1364 | 2048 . . . 2729 | 3414 . . . 4095 |
| 120 . . . 180 | 1365 . . . 2047 | 010 | 1365 . . . 2047 | 2730 . . . 3412 | 0 . . . 682 |
| 180 . . . 240 | 2048 . . . 2730 | 011 | 2048 . . . 2730 | 3413 . . . 4095 | 683 . . . 1364 |
| 240 . . . 300 | 2731 . . . 3412 | 001 | 2731 . . . 3412 | 0 . . . 681 | 1365 . . . 2047 |
| 300 . . . 360 | 3413 . . . 4095 | 101 | 3413 . . . 4095 | 682 . . . 1364 | 2048 . . . 2730 |

Table 2. Hall code mapping by addition

RESOLVER HALL DECODING CIRCUIT

RELATED APPLICATION DATA

This application claims priority of U.S. Provisional Application No. 60/827,106 filed on Sep. 27, 2006, which is incorporated herein by reference in its entirety.

FIELD OF THE INVENTION

The present invention relates generally to position sensing devices used in motion control and, more particularly, to a circuit for converting position data to Hall code format for use with Hall-type inputs.

BACKGROUND OF THE INVENTION

In conventional direct current (DC) motors, commutators and brushes are used to switch motor winding current as required for motor rotation. With the advent of brushless DC motors (BLDC), some form of rotor position measurement is used to control power transistors that actually switch motor current. To enable such operation, an absolute position of the rotor is measured to identify an electrical position of the rotor.

Integrated circuits of existing BLDC motor controllers are designed to accept Hall-effect type rotor position inputs. As is well known in the art, Hall-effect type inputs (also referred to as Hall inputs or simply Hall code) provide absolute position data (i.e., each position is assigned a unique bit combination and, therefore, the correct position is known immediately after power up without the need for a calibration step). In electric motor applications, the Hall inputs provide enough information (e.g., an absolute position within ±30 electrical degrees) to commutate a three-phase brushless DC motor in an on and off state.

In high reliability applications, resolvers are often used for determining rotor position. As is well known in the art, a resolver is a type of rotary electrical transformer used for measuring degrees of rotation. Since resolver output data is not directly compatible with Hall inputs, a conversion is performed. Typically, a resolver-to-digital converter is used to obtain a digital representation of rotor position. Then, the digital representation is converted to Hall inputs (digital to Hall code mapping).

Figure 1:
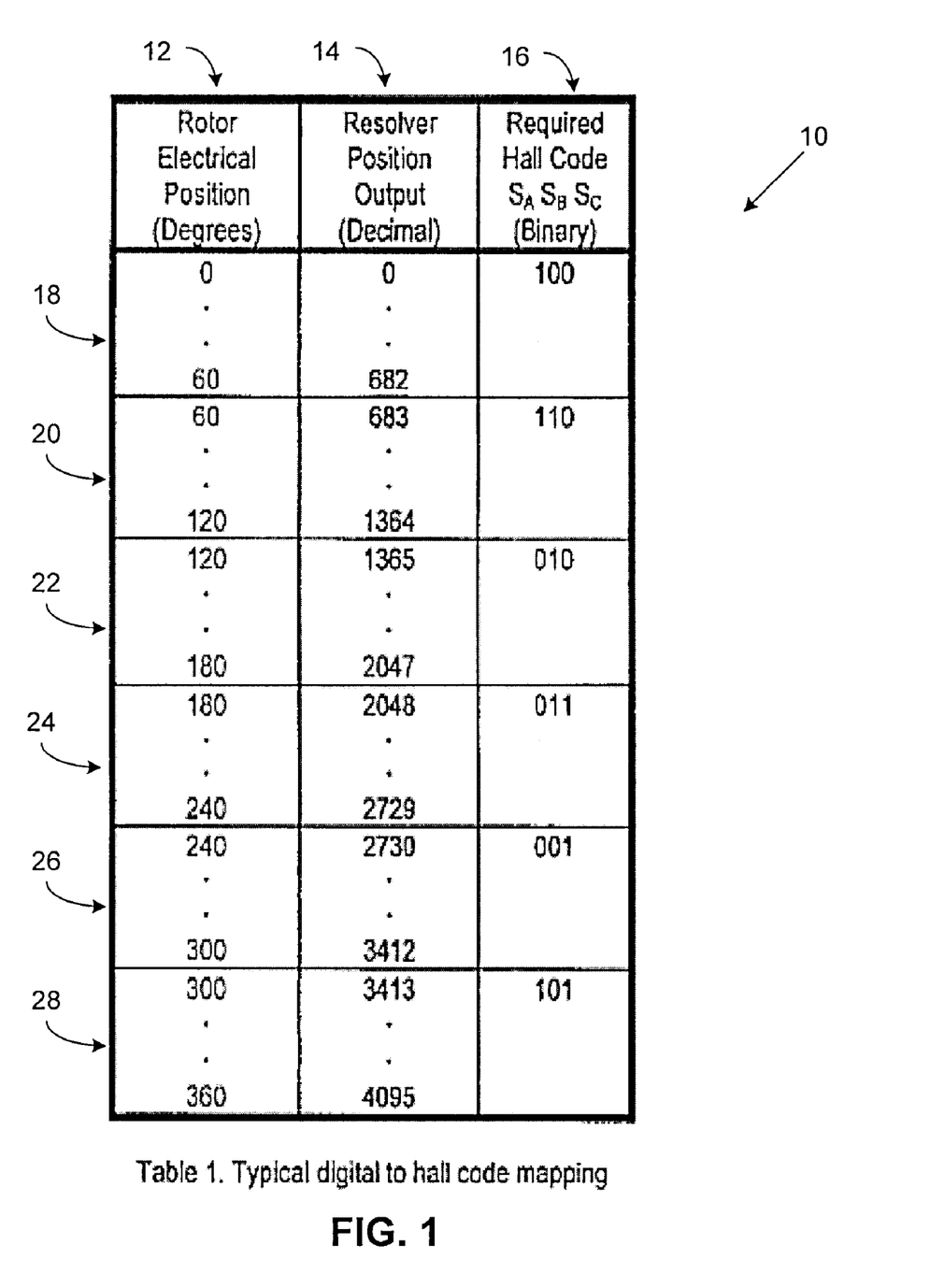
FIG. 1 is a table illustrating a conventional digital to Hall code mapping for a 12-bit resolver.

FIG. 1 illustrates a digital to Hall code mapping table 10 that shows the conversion from resolver data to Hall code. The first column 12 of the table 10 is the actual rotor position of the motor and/or resolver in electrical degrees, and the second column 14 is actual resolver output data (represented as a 12-bit decimal number) corresponding to the actual rotor electrical position, wherein one complete revolution of the resolver (360 degrees) represents 4096 counts (0-4095). The third column 16 of the table 10 is the Hall code corresponding to the resolver output data.

As can be seen in FIG. 1, the Hall code is represented by six different binary values and, thus, the mapping of table 10, in addition to the three columns 12, 14 and 16, is divided into six rows 18, 20, 22, 24, 26 and 28, wherein each row spans 60 degrees of rotor rotation.

The mapping of table 10 may be implemented, for example, via a programmable memory device so as to directly map every digital input to the corresponding Hall code output. While this method works well, it requires a programmable device and, therefore, a design verification procedure, which can add significant time and/or cost, is generally required for aircraft use.

Another method for implementing the mapping of table 10 involves the use of digital comparators. More specifically, a series of comparators may be used where, for example, $S_A$ is logic one when the resolver data is greater than or equal to 3413 and less than or equal to 1364. This comparator method can be implemented with a programmable device (e.g., a CPLD or an FPGA), or it can be implemented in hardware. Again, the programmable device is not desirable for aircraft use because of the associated verification procedure. The hardware implementation, while not requiring the verification procedure, requires a significant number of devices to implement the mapping.

SUMMARY OF THE INVENTION

The present invention provides a device and method for generating Hall code data from position output data by addition, thereby eliminating the need for complex circuitry and/or programmable devices. The addition is truncated to the number of bits of the position data and any carry out from the addition is discarded.

More particularly, predetermined numbers, preferably determined as one-third and two-thirds of a maximum value of the position data, are added to the position data, and Hall code $S_A$ and $S_B$ are determined from a most significant bit (MSB) of the sum of each respective addition. Hall code $S_C$ is determined based on the value of the MSB of the position data.

For example, in a 12-bit resolver, 4096 different position states may be determined. One third and two-thirds of 4096 is 1365 and 2731, respectively. To generate Hall code $S_A$, 2731 is added to the 12-bit position data, and then $S_A$ is set to the value of the MSB of this sum. $S_B$ is generated in a manner similar to $S_A$, except that instead of adding 2731, 1365 is added to the position data, and this sum is used to determine $S_B$. Hall code $S_C$ is set to the value of the MSB of the 12-bit position data.

According to one aspect of the invention, there is provided a device for converting position data to Hall code data, comprising: a data input for providing the position data; a data output for providing the Hall code data; a first adder circuit operative to provide a sum of a first predetermined number and a value provided by the data input; and a memory circuit for storing a plurality of data, wherein a most significant bit of the data input is provided to a first storage location of the memory circuit, and a most significant bit of the first adder circuit's sum is provided to a second storage location of the memory circuit, and wherein an output of the memory circuit is operatively coupled to the data output.

According to another aspect of the invention, there is provided a method for converting position data having a first number of bits to Hall code data having a second number of bits, comprising: adding a first predetermined number to the position data to derive a first sum; and setting a first bit of the Hall code data based on a most significant bit of the first sum; and outputting the Hall code data.

According to another aspect of the invention, there is provided a device for converting position data to Hall code data, wherein Hall code $S_A$ is set equal to a most significant bit (MSB) of a sum of the position data and a first predetermined number, Hall code $S_B$ is set equal to an MSB of a sum of the position data and a second predetermined number different from the first predetermined number, and Hall code $S_C$ is set equal to an MSB of the position data.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed.

DETAILED DESCRIPTION

In the detailed description that follows, corresponding components have been given the same reference numerals, regardless of whether they are shown in different embodiments of the present invention. To illustrate the present invention in a clear and concise manner, the drawings may not necessarily be to scale.

The present invention relates to a device and method for mapping digital position data to Hall code format. The mapping is performed by way of addition, which simplifies implementation of the mapping. In particular, hardware implementations of the mapping may be carried out, for example, using simple adder circuits. In performing the addition, the resulting sum is truncated to the resolution of the position data (e.g., for 12-bit position data, the sum is truncated to twelve bits) and any carry out is discarded.

The invention will be described in the context of an absolute position sensor, such as a resolver, that provides position data having 12-bit resolution. The invention, however, is applicable to any absolute position sensor (e.g., an absolute encoder, etc.) having resolutions other than twelve bits. Further, in the examples provided herein, the angular and/or electrical position of a rotary portion of the position sensor is determined within sixty degree angular segments (±30 degrees). Sixty degrees of resolution is sufficient for use with three-phase brushless DC motors. However, for other types of motors, (e.g., six-phase brushless DC motors), the angular segments may be other than sixty degrees, e.g., thirty degree segments (±15 degrees).

Figure 2:
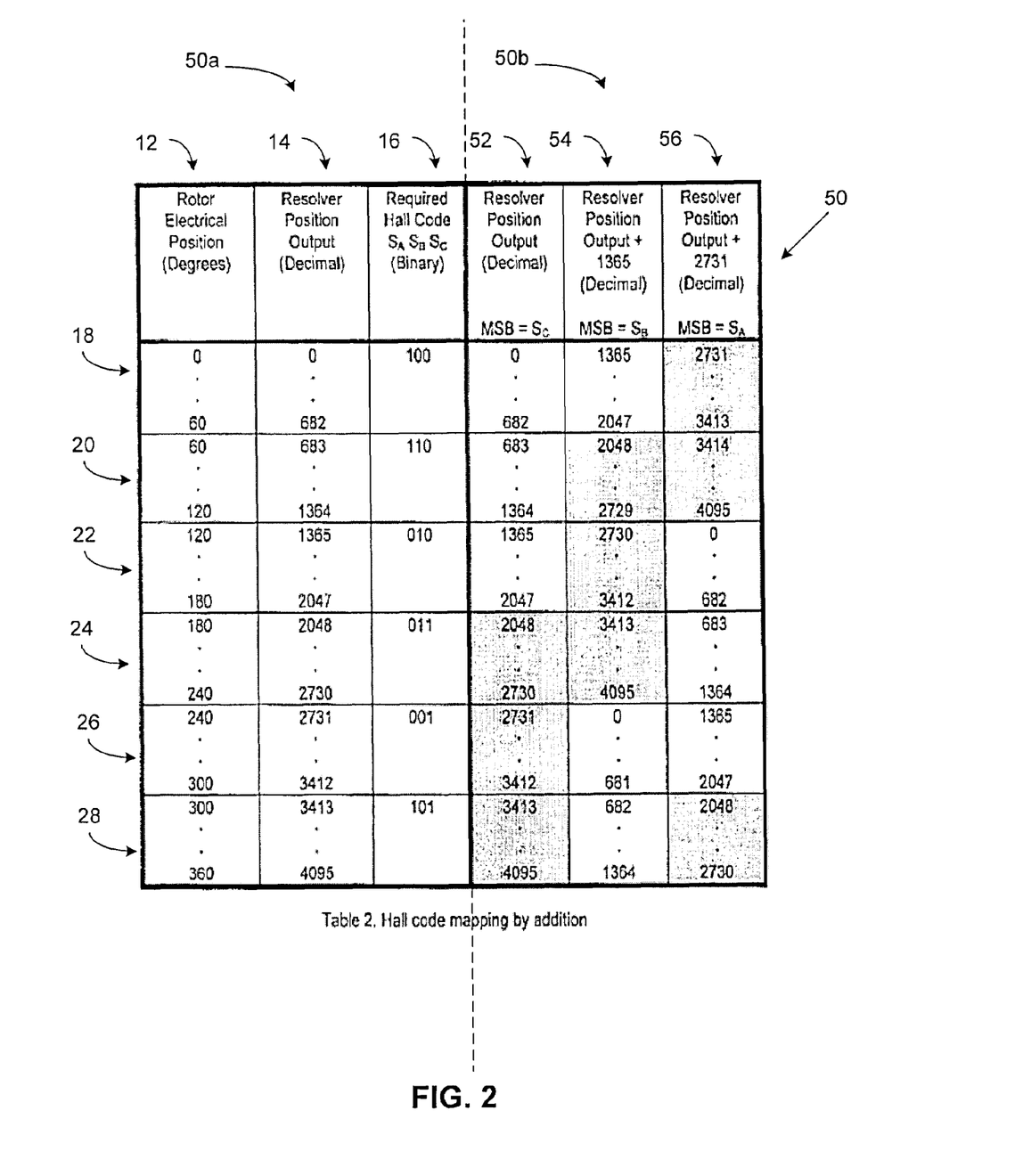
FIG. 2 is table illustrating an exemplary digital to Hall code mapping by addition in accordance with the invention.

Referring to FIG. 2, there is shown an exemplary mapping table 50 in accordance with the invention, wherein a first portion 50a of the mapping table 50 is identical to the mapping table 10 of FIG. 1. In other words, the first portion 50a of the mapping table 50 illustrates the desired mapping from resolver position data to Hall code data. A second portion 50b of the mapping table 50 illustrates how the desired result can be achieved by adding predetermined constants to the resolver position data.

As in FIG. 1, the first portion 50a of the mapping table 50 includes three columns 12-16 and six rows 18-28. The columns 12-16 include the actual electrical rotor position of the resolver and/or motor in degrees (column 12), the actual decimal resolver output data corresponding to the actual rotor position (column 14), and the desired Hall code corresponding to the resolver output data (column 16). Additionally, each row 18-28 represents sixty degrees of rotation of the resolver (or motor) shaft.

The second portion 50b of the mapping table 50 illustrates a method of deriving the desired Hall code (as shown in the third column 16) from the resolver position output (as shown in column 14) by simple addition. More specifically, and for a resolver having 12-bit resolution, $S_A$ (column 52) can be derived by adding 2731 to the resolver position output, discarding any carry out, truncating to twelve bits, and then analyzing the most significant bit (MSB) of the sum. $S_B$ (column 54) can be derived by adding 1365 to the resolver position output, discarding any carry out, truncating to twelve bits, and then analyzing the MSB of the sum. $S_C$ (column 56) can be derived simply by analyzing the MSB of the resolver position output. In the context of addition, the derivation of $S_C$ can be thought of as adding zero to the resolver position output and then analyzing the $MS_B$.

The numbers 1365 and 2731 as used to determine $S_B$ and $S_A$ are derived based on the resolution of the position data. In the present example, the position data has 12-bit resolution (4096), and the two addends 1365 and 2731 are derived from one-third and two-thirds of 4096. The values of one-third and two-thirds of the position data are based on the Hall code outputs, which are basically a 3-phase output. For example, $S_B$ is 120 degrees ahead of $S_C$, and $S_A$ is 240 degrees ahead of $S_C$. Based on this relationship between $S_A$, $S_B$ and $S_C$, the position data can be divided into thirds. As will be appreciated, the addends may be different for position data having resolution other than 12-bits.

With reference to the first row 18 of the mapping table 50, the resolver position output corresponding to the rotor electrical position between 0 degrees and 60 degrees varies between 0 and 682 counts. Assuming the current rotor position is 60 degrees (corresponding to resolver position output of 682 counts), then $S_A$ can be determined by adding 2731 to 682, which results in 3419. For 12-bit data, the number 3419 is represented in binary as 1101 0101 1011. In this case, the MSB of 3419 is 1 and, therefore, $S_A$ is set to 1.

Moving to $S_B$, instead of adding 2731 to the resolver position output, 1365 is added to the resolver position output, which in this example yields a value of 2047. For 12-bit data, the number 2047 is represented in binary as 0111 1111 1111, and as is evident, the MSB is 0. Thus, $S_B$ is set to 0.

With respect to $S_C$, the MSB of resolver position output is analyzed, as addition is not necessary. However, derivation of $S_C$ may be visualized as including addition step wherein one addend is the resolver position data (e.g., 682) and the other addend is 0, which yields the resolver position data (e.g., 682). For 12-bit data, 682 is represented in binary as 0010 1010 1010. Since the MSB is 0, $S_C$ is also set to 0.

Now combining the three derived values for $S_A$, $S_B$ and $S_C$ yields a Hall code of 100, which corresponds to a resolver position output of 682 counts. Although not expressly shown herein, the same Hall code will be produced for all resolver position outputs between 0 and 682 counts.

The same procedure can be applied to any of the rows in the mapping 50. For example, in the third row 22, the rotor electrical position may be any number between 120 degrees and 180 degrees. Assuming an electrical position of 120 degrees, the corresponding resolver position output is 1365, which, by adding and truncating to twelve bits as described herein, yields the following:

$S_A$=1365+2731=4096=0 (truncated)=0000 0000 0000

$S_B$=1365+1365=2730=1010 1010 1010

$S_C=1365+0=1365=0101\ 0101\ 0101$

Then, after analyzing the MSB for each result, $S_A$ is set to 0, $S_B$ is set to 1 and $S_C$ is set to 0, i.e., the Hall code for resolver position output of 1365 (120 degrees) is 010. Other examples are provided below.

For 240 degree rotor electrical position, the corresponding resolver data is 2730 counts.

$S_A=2730+2731=5461=1365\ (\text{truncated})=0101\ 0101\ 0101$ $S_B=2730+1365=4095=1111\ 1111\ 1111$ $S_C=2730+0=2730=1010\ 1010\ 1010$ After analyzing the MSB for each result, $S_A$ is set to 0, $S_B$ is set to 1 and $S_C$ is set to 1, i.e., the Hall code for resolver position output of 2730 (240 degrees) is 011

For 360 degree rotor electrical position, the corresponding resolver data is 4095 counts.

$S_A=4095+2731=6826=2730\ (\text{truncated})=1010\ 1010\ 1010$ $S_B=4095+1365=5460=1364\ (\text{truncated})=0101\ 0101\ 0100$ $S_C=4095+0=4095=1111\ 1111\ 1111$ After analyzing the MSB for each result, $S_A$ is set to 1, $S_B$ is set to 0 and $S_C$ is set to 1, i.e., the Hall code for resolver position output of 4095 is 101

Figure 3:
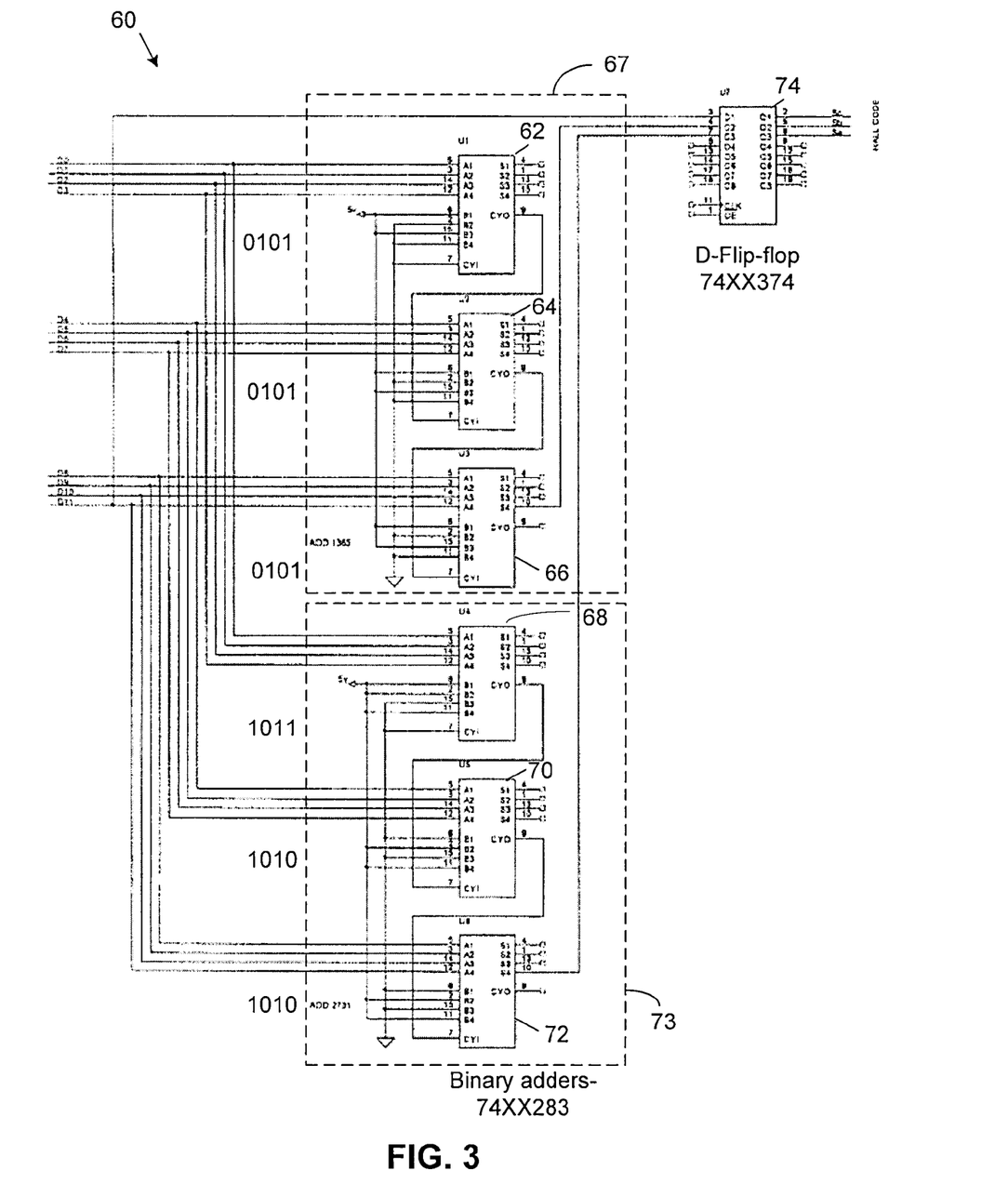
FIG. 3 is an exemplary implementation of the mapping of FIG. 2 in accordance with the invention

Moving now to FIG. 3, an exemplary hardware circuit 60 for converting position output data to Hall code is shown. The exemplary circuit 60 converts 12-bit resolver position output data to 3-bit Hall code. The circuit 60, however, may be readily modified to accept position data having other than twelve bits and/or to output Hall code having other than three bits.

Further, while the circuit 60 is implemented using 4-bit binary adders and a D-flip-flop, such implementation is merely exemplary. The circuit may be implemented using other hardware configurations that perform the Hall code generation as described herein.

In the exemplary circuit 60, the twelve data bits D0-D11 from the position feedback device (e.g., from the resolver) are provided as first inputs (A1-A4) to six 4-bit binary adders 62, 64, 66, 68, 70 and 72 (e.g., 74XX283 binary adders or equivalent). More specifically, data bits D0-D3 are provided to inputs (A1-A4) of the first binary adder 62 and of the fourth binary adder 68, data bits D4-D7 are provided to inputs (A1-A4) of the second binary adder 64 and of the fifth binary adder 70, and data bits D8-D11 are provided to inputs of the third binary adder 66 and of the sixth binary adder 72.

The first, second and third binary adders 62, 64 and 66 correspond to the derivation of $S_B$ and are referred to as a first adder circuit 67. Similarly, the fourth, fifth and sixth binary adders 68, 70 and 72 correspond to the derivation of $S_A$ and are referred to as a second adder circuit 73. Thus, the first adder circuit 67 as a whole is configured to add 1365 to the position output data, and the second adder circuit 73 as a whole is configured to add 2731 to the position output data. Since the present example is described using 4-bit binary adders, the numbers 1365 and 2731 will be broken into individual 4-bit portions for each 4-bit binary adder, as described below.

A second input (B1-B4) for each of the first, second and third binary adders 62, 64 and 66 is configured to be 5 (1365 is represented as 0101 0101 0101 in binary, or as 555 in hexadecimal). A second input (B1-B4) of the fourth binary adder 68 is configured to be 11 or "B" hexadecimal, and second inputs (B1-B4) of the fifth and sixth binary adders 70 and 72 are configured to be 10 ("A" hexadecimal) (2731 is represented as 1010 1010 1011 in binary, or as AAB in hexadecimal).

The carry output (CY0) of the first binary adder 62 is provided to the carry input (CYI) of the second binary adder 64, and the carry output (CY0) of the second binary adder 64 is provided to the carry input (CYI) of the third binary adder 66. The carry output (CY0) of the third binary adder 66 is floating (i.e., no connections are made to this output).

Similarly, the carry output (CY0) of the fourth binary adder 68 is provided to the carry input (CYI) of the fifth binary adder 70, and the carry output (CY0) of the fifth binary adder 70 is provided to the carry input (CYI) of the sixth binary adder 72. The carry output (CY0) of the sixth binary adder 72 also is floating.

The four-bit sum output (S1-S4) of the first 62, second 64, fourth 68 and fifth 70 binary adders are floating. For the third and sixth binary adders 66 and 72, the first three bits (S1-S3) of the four-bit sum output are floating.

The MSB of the position data (D11) is provided to a first input (D1) of a memory circuit 74, such as an octal D-flip-flop (e.g., a 74374 D-flip-flop or equivalent), for example, or any memory device capable of retaining at least one bit of data for each Hall code output. Further, the fourth output bit (S4) of the third binary adder's 4-bit sum is provided to the second input (D2) of the D-flip-flop 74, and the fourth output bit (S4) of the sixth binary adder's 4-bit sum is provided to the third input (D3) of the D-flip-flop. The remaining inputs of the D-flip-flop are floating.

The first three output bits (Q1-Q3) of the D-flip-flop 74 form the Hall code corresponding to the resolver position data, wherein $S_C$, $S_B$ and $S_A$ correspond to outputs Q1, Q2 and Q3, respectively. The remaining outputs of the D-flip-flop 74 are floating.

When provided with 12-bit position data, the circuit 60, based on simple addition, will provide the corresponding Hall code. The first adder circuit 67 effectively adds 1365 to the position data, while the second adder circuit 73 adds 2731 to the position data. The D-flip-flop receives the MSB of the position data, as well as the MSB of the respective sums from the first and second adder circuits 67 and 73. These MSB's then are combined by the D-flip-flop 74 to and provided to the Hall output lines $S_A$, $S_B$ and $S_C$.

The circuit 60 can be implemented with a relatively few number of integrated circuits, which minimizes costs. Moreover, the circuit is hardware based and, therefore, a design verification procedure is not required for aircraft use.

Figure 4:
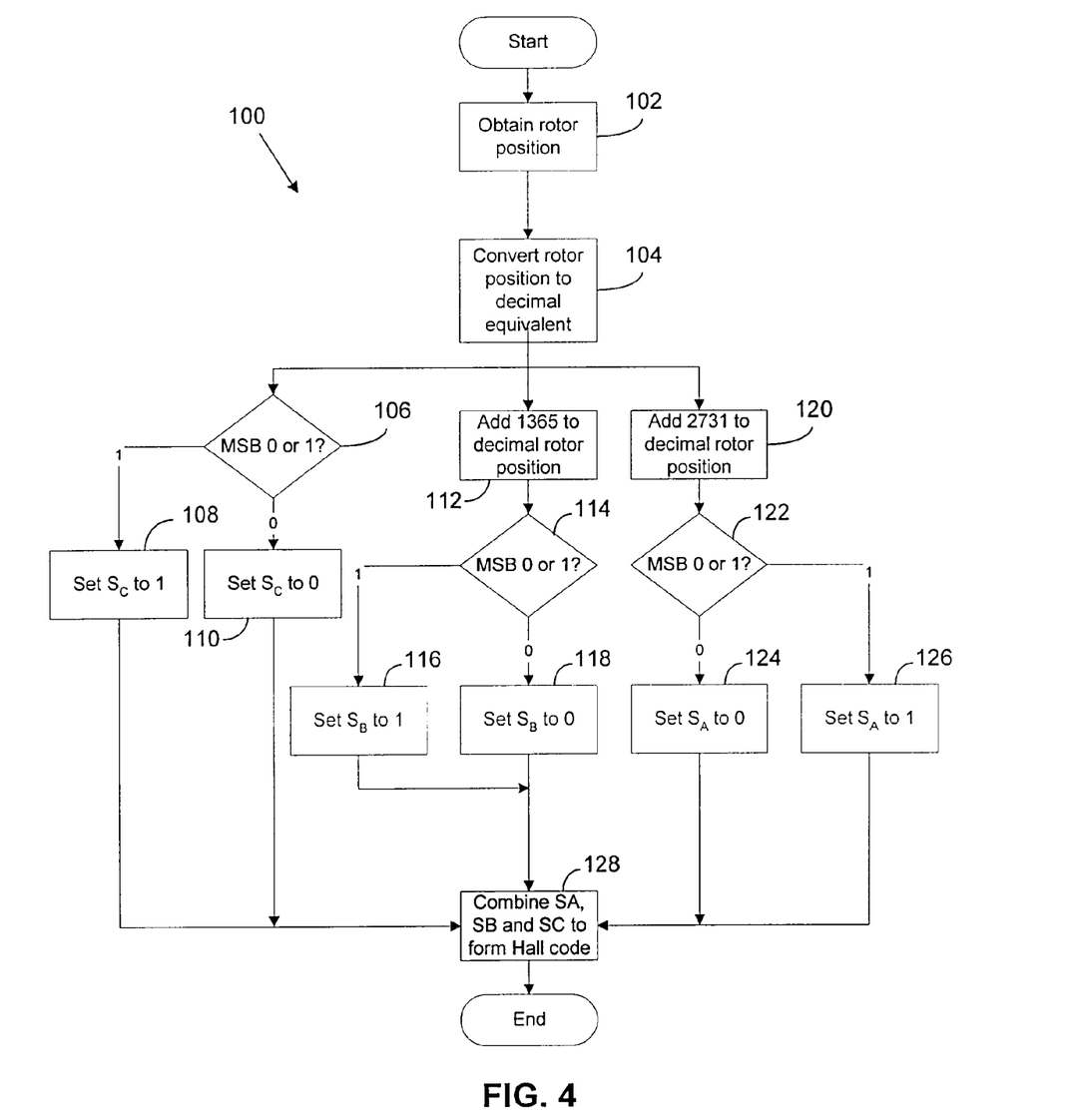
FIG. 4 is a flow diagram illustrating steps of an exemplary method for implementing a digital to Hall code mapping in accordance with the invention.

Moving now to FIG. 4, a flow diagram 100 illustrating a method of generating Hall code from position data in accordance with the invention is shown. The flow diagram includes a number of process blocks arranged in a particular order. As should be appreciated, many alternatives and equivalents to the illustrated steps may exist and such alternatives and equivalents are intended to fall with the scope of the claims appended hereto. Alternatives may involve carrying out additional steps or actions not specifically recited and/or shown, carrying out steps or actions in a different order from that recited and/or shown, and/or omitting recited and/or shown steps. Alternatives also include carrying out steps or actions concurrently or with partial concurrence.

Beginning at block 102, the rotor position data is obtained from the position sensor using conventional techniques. For example, a resolver includes a fixed exciter winding and two two-phase windings that rotate with the resolver shaft, wherein signals on the two-two phase windings are derived based on their angular relationship to the exciter winding. The signals on the two two-phase windings are sinusoidal signals that are out of phase from one another by ninety degrees. The respective signals can be converted to digital form, and a voltage level and/or phase of the signals with respect to one another and a reference signal may be analyzed to determine an absolute position of the shaft. This absolute position may be expressed as a decimal number, for example, as indicated at block 104.

After block 104, three separate branches are shown (i.e., branches beginning with blocks 106, 112, and 120). In the example of FIG. 4, these branches are executed in parallel. It will be appreciated by those having ordinary skill in the art, however, that the logic of FIG. 4 may be modified so as to implement the three branches in a serial manner.

At block 106, the MSB of the position data is checked to see if it is a logical one or a logical zero. If the MSB is a logical one, then at block 108 $S_C$ is set to a 1, otherwise at block 110 $S_C$ is set to 0.

Next at block 112, 1365 is added to the decimal equivalent of the rotor position, and then at block 114 the MSB of the sum is used to determine the value of $S_B$. If the MSB is a logical one, then at block 116 $S_B$ is set to a 1, otherwise at block 118 $S_B$ is set to 0.

$S_A$ is derived in a similar manner to $S_B$, except in stead of adding 1365 to the resolver position, 2731 is added to the resolver position, as indicated at block 120. Then at block 122 the MSB of the sum is used to determine the value of $S_A$. If the MSB is a logical one, then at block 124 $S_A$ is set to a 1, otherwise at block 126 $S_A$ is set to 0.

At block 128, the derived values for $S_A$, $S_B$ and $S_C$ are combined to form a binary number that represents the Hall code for the equivalent resolver position.

The above described methodology can be implemented by a computer program which, when it is executed by computer or the like, performs one or more of the method steps described above. Alternatively, and as described herein, the method can be implemented via a hardware circuit.

Figure 5:
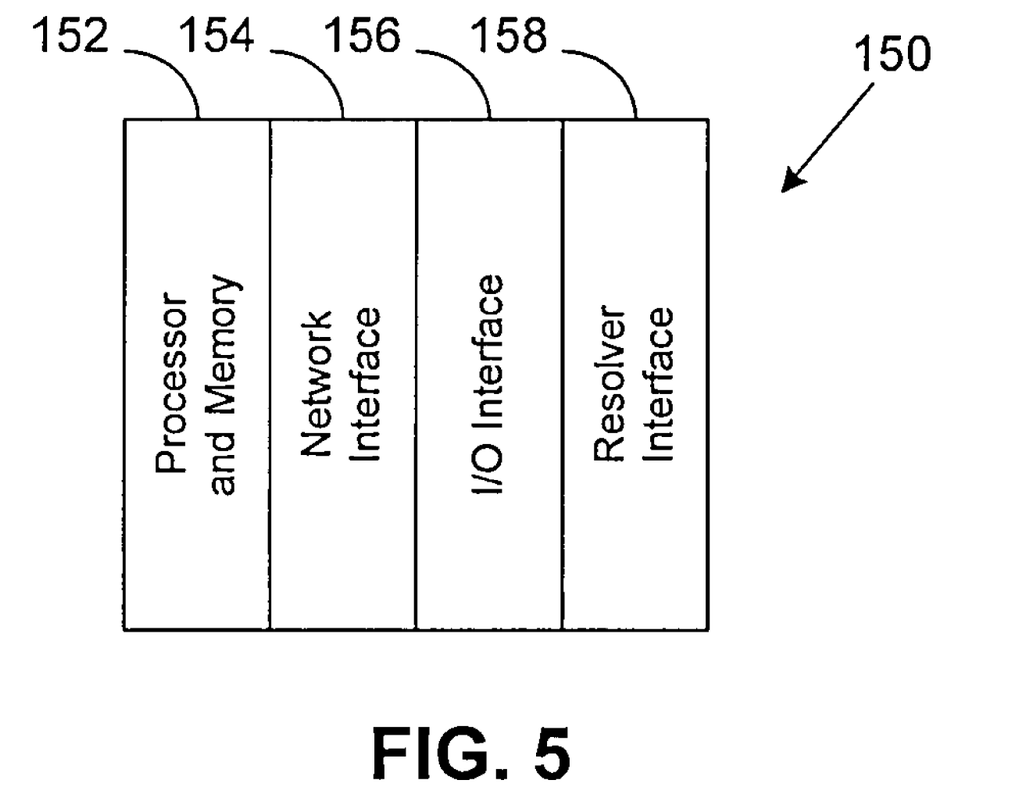
FIG. 5 is an exemplary controller that may be used to implement software-based Hall code mapping in accordance with the invention.

FIG. 5 illustrates and exemplary microprocessor-based controller 150 (e.g., a PLC or the like) that can execute a program that implements the method described in FIG. 4 for obtaining Hall code data corresponding position data. The controller 150 includes a processor and memory 152, wherein the processor may be any conventional processor used in control systems, motion control, etc. The memory can include RAM, ROM, EPROM, EEPROM, magnetic storage devices, optical storage devices, or the like. A network interface 154 allows the controller 150 to communicate with devices external to the controller 150, such as other programmable logic controllers (PLCs), motion controllers, computers, etc. An input/output (I/O) interface 156 accepts digital and analog I/O for interfacing with the external devices. The controller 150 also includes a feedback interface for receiving data from a resolver or the like. As will be appreciated, the controller may include a number of different modules as required by the specific application.

A program can be stored in memory of the controller 150 and executed by the processor so as to implement the method of FIG. 4. The actual code for performing the method described herein can be readily programmed by a person having ordinary skill in the art of computer programming in any of a number of conventional programming languages based on the disclosure herein. Consequently, further detail as to the particular code itself has been omitted for sake of brevity. As will be appreciated, the various computer codes for carrying out the processes herein described can be embodied in computer-readable media.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A device for converting position data to Hall code data, comprising:
    a data input for providing the position data;
    a data output for providing the Hall code data;
    a first adder circuit operative to provide a sum of a first predetermined number and a value provided by the data input; and
    a memory circuit for storing a plurality of data,
        wherein a most significant bit of the data input is provided to a first storage location of the memory circuit, and a most significant bit of the first adder circuit's sum is provided to a second storage location of the memory circuit, and
        wherein an output of the memory circuit is operatively coupled to the data output.

2. The device according to claim 1, further comprising a second adder circuit operative to provide a sum of a second predetermined number and the value provided by the data input, wherein a most significant bit of the second adder circuit's sum is provided to a third storage location of the memory circuit.

3. The device according to claim 2, wherein the first and second adder circuits each comprise three 4-bit binary adders.

4. The device according to claim 2, wherein a carry out of both the first and second adder circuit is discarded.

5. The device according to claim 2, wherein the sum of the first and second adder circuits is truncated to a number of bits of the position data.

6. The device according to claim 2, wherein the first predetermined number is 1365 and the second predetermined number is 2731.

7. The device according to claim 2, wherein the first predetermined number is two-thirds of a maximum value of the position data, and the second predetermined number is one-third of the maximum value of the position data.

8. The device according to claim 1, wherein the first number of bits is 12 and the second number of bits is 3.

9. The device according to claim 1, wherein the memory circuit comprises a D-flip-flop circuit.

10. The device according to claim 1, wherein the device is an absolute position feedback device.

11. The device according to claim 10, wherein the absolute position feedback device is a resolver or an absolute encoder.

12. A method for converting position data having a first number of bits to Hall code data having a second number of bits, comprising:
  adding a first predetermined number to the position data to derive a first sum; and
  setting a first bit of the Hall code data based on a most significant bit of the first sum; and
  outputting the Hall code data.

13. The method according to claim 12, further comprising:
  adding a second predetermined number to the position data to derive a second sum, said second predetermined number being different from the first predetermined number; and
  setting a second bit of the Hall code data based on a most significant bit of the second sum.

14. The method according to claim 13, further comprising setting a third bit of the Hall code data based on a most significant bit of the position data.

15. The method according to claim 13, wherein adding the first predetermined number and adding the second predetermined number each include discarding any carry and truncating the first and second sums to the first number of bits.

16. The method according to claim 13, wherein adding the first predetermined number includes using 2731 as the first predetermined number, and adding the second predetermined number includes using 1365 as the second predetermined number.

17. The method according to claim 13, further comprising selecting the first predetermined number as two-thirds of a maximum value of the position data, and selecting the second predetermined number as one-third of the maximum value of the position data.

18. The method according to claim 12, wherein the first number of bits is 12 and the second number of bits is 3.

19. A device for converting position data to Hall code data having bits $S_A$, $S_B$ and $S_C$, wherein Hall code $S_A$ is set equal to a most significant bit (MSB) of a sum of the position data and a first predetermined number, Hall code $S_B$ is set equal to an MSB of a sum of the position data and a second predetermined number different from the first predetermined number, and Hall code $S_C$ is set equal to an MSB of the position data.

20. The device according to claim 19, wherein the device is a resolver or an absolute encoder.

* * * * *